United States Patent
Khullar

[11] Patent Number: 5,838,735
[45] Date of Patent: Nov. 17, 1998

[54] METHOD AND APPARATUS FOR COMPENSATING FOR A VARYING D.C. OFFSET IN A SAMPLED SIGNAL

[75] Inventor: Anders Khullar, Bjärred, Sweden

[73] Assignee: Telefonaktiebolaget LM Ericsson, Stockholm, Sweden

[21] Appl. No.: 679,461

[22] Filed: Jul. 8, 1996

[51] Int. Cl.⁶ .................................................. H04L 27/06
[52] U.S. Cl. ......................................... 375/319; 455/324
[58] Field of Search ................................... 375/316, 319, 375/285, 346; 455/324, 296

[56] References Cited

U.S. PATENT DOCUMENTS

| | | | |
|---|---|---|---|
| 3,953,805 | 4/1976 | Couvillon | 327/307 |
| 4,318,128 | 3/1982 | Sauvanet. | |
| 4,625,320 | 11/1986 | Butcher | 375/319 |
| 4,873,702 | 10/1989 | Chiu | 375/319 |
| 4,902,979 | 2/1990 | Puckette, IV | 329/343 |
| 4,944,025 | 7/1990 | Gehring et al. | 455/207 |
| 5,140,699 | 8/1992 | Kozak | 455/84 |
| 5,212,826 | 5/1993 | Rabe et al. | 455/214 |
| 5,222,078 | 6/1993 | Cason et al. | 375/319 |
| 5,241,702 | 8/1993 | Dent | 455/278.1 |
| 5,303,414 | 4/1994 | Brinkhaus | 455/296 |
| 5,341,218 | 8/1994 | Kaneko et al. | 348/695 |
| 5,369,411 | 11/1994 | Lisle, Jr. | 342/194 |
| 5,371,763 | 12/1994 | Ota et al. | 375/319 |
| 5,412,692 | 5/1995 | Uchida | 375/317 |
| 5,422,889 | 6/1995 | Sevenhans et al. | 370/442 |
| 5,530,929 | 6/1996 | Lindqvist et al. | 455/324 |
| 5,568,520 | 10/1996 | Lindquist et al. | 455/324 |
| 5,579,347 | 11/1996 | Lindquist et al. | 455/324 |
| 5,583,706 | 12/1996 | Dubley et al. | 360/46 |

FOREIGN PATENT DOCUMENTS

| | | |
|---|---|---|
| 2 267 629 | 12/1993 | United Kingdom. |
| WO91/05427 | 4/1991 | WIPO. |

OTHER PUBLICATIONS

Patent Abstracts of Japan, vol. 95, No. 003, JP-A-07-066793 (Mar. 10, 1995).
Patent Abstracts of Japan, vol. 018, No. 342 (E-1570), JP-A-085865 (Mar. 25, 1994).

*Primary Examiner*—Tesfaldet Bocure
*Attorney, Agent, or Firm*—Burns, Doane, Swecker & Mathis, L.L.P.

[57] ABSTRACT

Methods and apparatus for detecting, estimating, and compensating for unwanted d.c. offsets in sampled signals in a direct conversion receiver are described. These methods and devices can be used for varying d.c. offsets, ramps, and steps to realize a direct-conversion receiver for modem cellular communication systems that does not suffer performance degradation due to strong interferers.

4 Claims, 3 Drawing Sheets

METHOD AND APPARATUS FOR COMPENSATING FOR A VARYING D.C. OFFSET IN A SAMPLED SIGNAL

BACKGROUND

This invention relates to direct-conversion receivers for communication systems such as portable cellular phones, cordless phones, pagers, etc.

Demodulation and analog-to-digital (A/D) conversion of a communication signal, such as a radio signal, can be performed with a direct conversion receiver, which is also sometimes called a homodyne receiver. The signals are demodulated and spectrally translated down to the base band directly by having the frequency of the receiver's local oscillator be the same as the frequency of the received carrier signal. Since a direct-conversion receiver does not have any intermediate frequency (IF) stages, many filters can be omitted or simplified. Indeed, all filtering and signal processing can be done with digital logic, which may reduce hardware cost and design complexity compared with the corresponding analog processing.

Direct conversion was introduced for single-sideband radio receivers in the 1950's, but the technique is not limited to such systems. Direct conversion can be used with many different modulation schemes and is especially well suited for the quadrature modulation schemes of today, such as minimum shift keying (MSK) and quadrature amplitude modulation (QAM).

Various aspects of direct-conversion or homodyne receivers are described in U.S. Pat. No. 5,530,929 to Lindqvist and U.S. Pat. No. 5,241,702 to Dent and allowed U.S. Pat. Continuation application No. 08/699,774 and U.S. Pat. No. 5,712,637 by Lindquist et al. and U.S. Pat. No. 5,579,397 by Lindqvist et al. These documents are expressly incorporated here by reference.

The operation of a conventional direct-conversion radio receiver can be described as follows with reference to FIG. 1. A radio frequency (RF) signal having center frequency $f_c$ and bandwidth $BW_{rf}$ is received by an antenna 10 and then is filtered by a bandpass filter 20. The filtered signal produced by the bandpass filter is amplified by an amplifier 30, which preferably has low noise to improve the receiver's total noise figure.

The amplified filtered signal produced by the amplifier 30 is then down-converted to base band in an in-phase (I) channel and a quadrature phase (Q) channel by balanced mixers 40, 50. The mixers are driven by respective ones of sine (I) and cosine (Q) components produced from a sinusoidal signal generated by a local oscillator 60 by a suitable divider and phase shifter 70. According to the direct-conversion principle, the LO signal also has the frequency $f_c$.

The mixers 40, 50 effectively multiply the signal from the amplifier 30 and the I, Q components of the local oscillator. Each mixer produces a signal that has frequencies that are the sum and difference of the frequencies of the amplified filtered received signal and the local oscillator signal. The difference (down-converted) signals each have a spectrum that is folded over around zero frequency (d.c.) and spans from d.c. to $\frac{1}{2}BW_{rf}$.

The I and Q signals produced by the mixers are filtered by low-pass filters 80, 90 that remove the sum (up-converted) signals, as well as components that might be due to nearby RF signals. The filters 80, 90 set the noise bandwidth and thus the total noise power in the receiver. The I and Q base band signals are then usually amplified by amplifiers 100, 110, and provided to analog-to-digital converters 120, 122 and a digital signal processing (DSP) device 130.

With the configuration shown in FIG. 1, almost any type of modulation can be detected by programming the DSP device 130 appropriately to manipulate the digital samples of the quadrature I and Q signals. Such processing can include phase demodulation, amplitude demodulation, frequency demodulation, or hybrid demodulation schemes. It will be appreciated that the DSP device 130 may be implemented as hard-wired logic circuitry or, preferably, as an integrated digital signal processor, such as an application-specific integrated circuit (ASIC). Of course it will be understood that an ASIC may include hard-wired logic circuitry that is optimal for performing a required function, which is an arrangement commonly selected when speed or another performance parameter is more important than the versatility of a programmable digital signal processor.

A major problem with the conventional direct-conversion receiver is that second-order products of interferers (e.g., signals on the same and nearby RF communication channels) are produced by the mixers. One component of these second-order products is located at base band, and thus interferes with the desired base band signal, degrading performance. In some situations, this problem totally blocks communication in high-performance, direct-conversion receivers for today's time division multiple access (TDMA) digital cellular systems.

For an input signal $V_{in}$, a non-linear device, such as a mixer, will produce an output signal $V_{out}$ theoretically given by the following expression:

$$V_{out} = aV_{in} + bV_{in}^2 + \ldots$$

If the input signal $V_{in}$ is an interfering signal given by the following expression:

$$V_{in} = V_m \cos(\omega_c t)$$

where $V_m$ is the interferer's maximal amplitude and $W_c$ corresponds to the carrier frequency $f_c$, the second-order product $bV_{in}^2$ is given by the following expression:

$$bV_{in}^2 = \frac{bV_m^2}{2}[1 + \cos(2\omega_c t)]$$

It is clear from the preceding expression that the first term on the right is a distortion on the desired signal at base band, e.g., after the mixers 40, 50. The second term on the right can be neglected since it represents the up-converted (sum) signal centered around twice the carrier frequency that is removed by the filters 80, 90.

The distortion is a d.c. component if the interfering signal is either only a single carrier $f_c$ or a constant-envelope, frequency- or phase-modulated signal. Such a d.c. offset can be removed in many ways, such as the manner described in U.S. Pat. No. 5,241,702 to Dent, which was incorporated by reference above.

If the interferer is in some way an amplitude-modulated (AM) signal, viz., if $V_m$ is not a constant, the second-order product no longer simply introduces a constant d.c. offset. This happens in all digital communication systems due to their use of real AM signals and/or to their use of on/off switching of single-carrier or frequency- or phase-modulated signals. The d.c. offset induced in the base band signal by a strong radio transmitter may be very large compared to the wanted base band signal. Since in many cases the d.c. offset changes rapidly due to the interfering transmitter's being rapidly switched on and off, large steps in the d.c. level of the base band signals are generated, which are difficult to compensate.

In mobile telecommunication, different operators use the same frequency band for radio transmissions. In a time division multiple access (TDMA) communication system, e.g., a system operating according to the Global System for Mobile communication (GSM) standard, base station transmitters can be switched on and off without mutual synchronization. A large step from another base station that occurs in the middle of a burst, or time slot, being sent by a base station to a mobile station seriously impairs the quality of the connection when the mobile is equipped with a homodyne receiver. This varying d.c. level must be detected and removed.

In mobile telephony and other real-time applications, the time period needed for performing such detection and removal is also important. No complex post-processing methods that introduce delays can be used. Data storage capability may also be limited; this is typical of many portable receivers.

SUMMARY

It is an object of this invention to reduce the effect of varying d.c. offsets in the desired signal in a direct-conversion receiver.

It is a further object of this invention to realize a direct-conversion receiver for modern cellular communication systems that does not suffer performance degradation due to strong interferers.

In accordance with one aspect of Applicant's invention, there is provided in a direct conversion receiver an apparatus for compensating a current sample of a base band signal having a variable d.c. level. The apparatus comprises means for generating samples of the band signal; means for forming an estimate of the mean value of samples of the base band signal; means for detecting a change in the d.c. level of the base band signal based on the current sample; and means for generating the compensated sample by forming the difference between the current sample and the estimate, thereby substantially removing the change in the d.c. level.

In another aspect of Applicant's invention, the detecting means in the apparatus includes means for determining an upper limit value and a lower limit value, and means for comparing the current sample of the base band signal to the upper and lower limit values. The upper and lower limit values may be based on a maximal one of the samples of the base band signal, and the change in the d.c. level of the base band signal is detected when the current sample exceeds one of the limit values. In addition, the mean value estimate may be formed adaptively from a number of samples that corresponds to whether a change in the d.c. level has been detected.

In another aspect of Applicant's invention, there is provided a method of compensating a current sample of a base band signal having a variable d.c. level. The method comprises the steps of generating samples of the base band signal; forming an estimate of the mean value of samples of the base band signal; detecting a change in the d.c. level of the base band signal based on the current sample; and generating the compensated sample by forming the difference between the current sample and the estimate, thereby substantially removing the change in the d.c. level.

In this method, the detecting step may include the steps of determining an upper limit value and a lower limit value based on a maximal one of the samples of the base band signal, and comparing the current sample of the base band signal to the upper and lower limit values. The change in the d.c. level of the base band signal is detected when the current sample exceeds one of the limit values. Moreover, the mean value estimate may be formed adaptively from a number of samples that corresponds to whether a change in the d.c. level has been detected.

BRIEF DESCRIPTION OF THE DRAWINGS

Applicants' invention will be understood by reading this description in conjunction with the drawings in which.

DETAILED DESCRIPTION

Although the following description is in terms of a radio receiver having quadrature channels, it will be appreciated that Applicant's invention can be embodied in other forms of communication receiver, such as a wire-line receiver having a single channel.

In GSM, the received signal is phase modulated using GMSK, and ideally, no AM is present within the receive band of 935–960 MHZ. Nevertheless, a strong phase-modulated interferer (a blocking signal within the receive band) can introduce a d.c. offset in the base band that interferes with the desired signal. Switching such a strong interferer on and off introduces a stepping between two different d.c. offsets (i.e., AM). In GSM, the time for switching on and off is specified, and therefore the AM distortion is known in the time domain. (Approximately three bit periods are affected.)

For a GSM mobile receiver, it is also known that such an interferer can only be switched on or off once during a received burst. Thus for each GSM operator besides the operator serving the mobile, there can be only one d.c.-offset step during any received burst. In Sweden, for example, there are currently three operators in the GSM band and the potential for two d.c.-offset steps during any received burst. Applicant's invention is capable of handling such multiple steps.

Figure 2A:
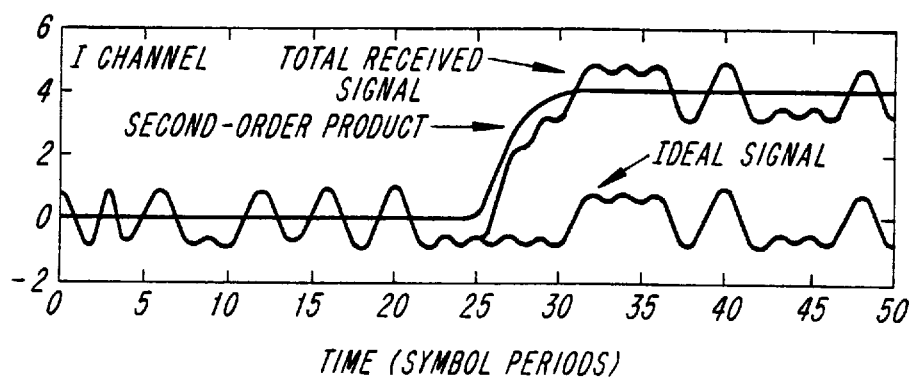
FIGS. 2a, 2b are time diagrams for signals in the I- and Q-channels of a direct-conversion receiver.
Figure 2B:
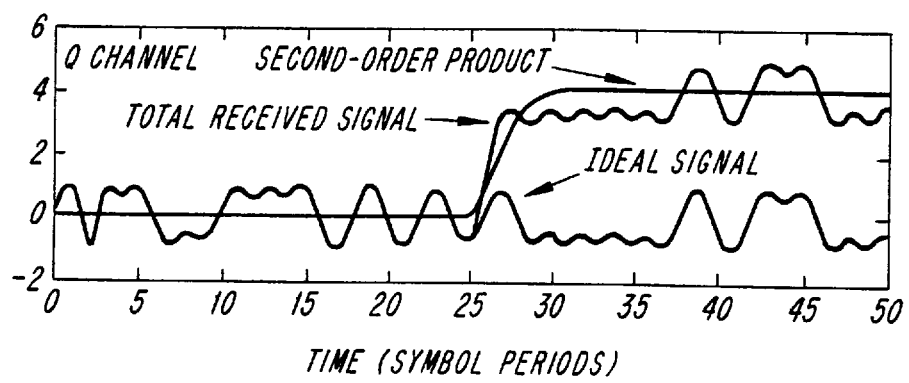

As shown in FIGS. 2a and 2b, the interfering signal producing the second-order product in the base band I- and Q-channel signals manifests itself in the time domain as two different d.c. levels connected by a ramp (due to the switching on or off) having known characteristics. In the figures, the ideal signal is the signal without the second-order product, and the total received signal is the sum of the ideal signal and the second-order product. The time scales on the abscissas and the amplitude scales on the ordinates are arbitrary.

While the sampled base band signal has a constant d.c. level, the magnitudes of the samples $x_i$ vary around a mean value, Xmean. For example, sample values that would be derived from the signals depicted in FIGS. 2a, 2b would vary between approximately ±1 and the mean value would be approximately zero for the time period between 0 and 20.

Figure 1:
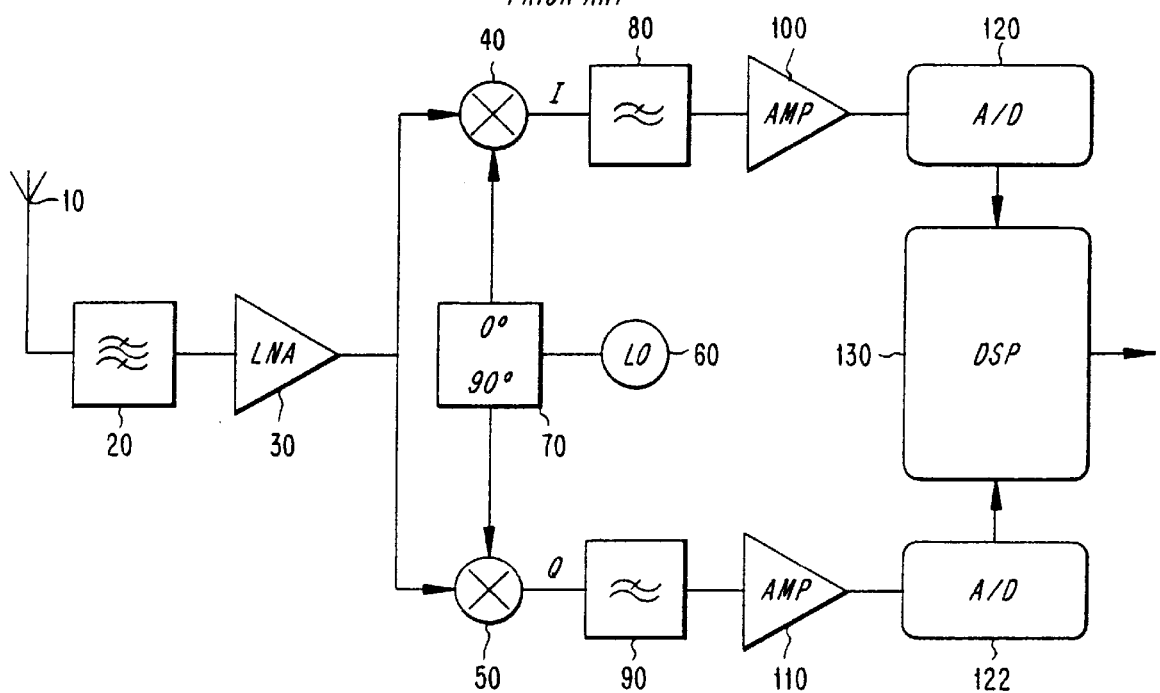
FIG. 1 is a block diagram of a direct-conversion receiver.
Figure 4:
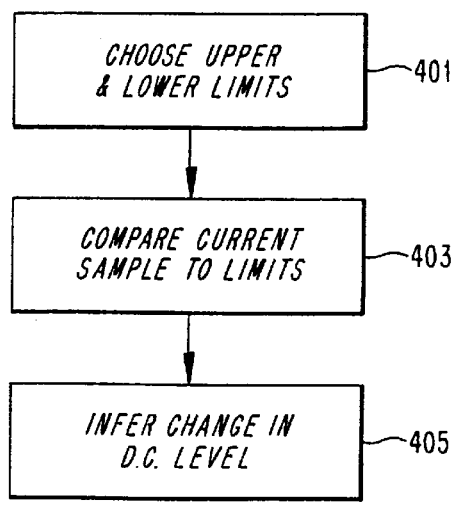
FIG. 4 is a flow chart of a method of detecting a change in the d.c. level of the base band signal in accordance with Applicant's invention.
Figure 3:
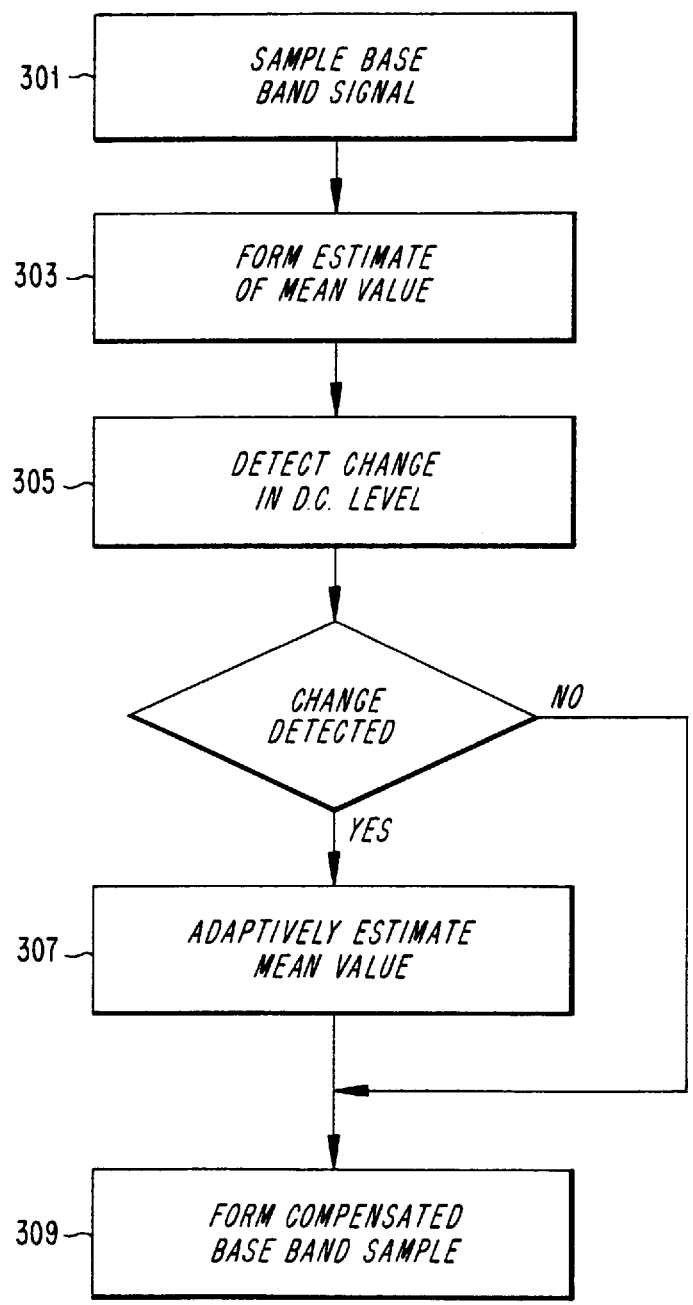
FIG. 3 is a flow chart of a method of compensating samples of a base band signal in accordance with Applicant's invention.

Compensating such a sampled signal involves generating compensated samples $xcomp_i$ according to the following expression:

$$xcomp_i = x_i - Xmean$$

where the index value i indicates the current sample. The operations necessary for generating the compensated samples are carried out by the DSP device 130 using the sampled I- and Q-channel signals produced by the A/D converters 120, 122 on a sample-by-sample basis. These operations are illustrated by FIGS. 3 and 4, which are flowcharts of methods in accordance with Applicant's invention. The compensated I- and Q-channel sampled signals are then further processed in the DSP device 130 to obtain the desired information signal.

Using samples of the base band signal (block 301 in FIG. 3), several different ways can be used for estimating the value of Xmean, the mean value of the samples (block 303). For example, a sliding Xmean can be determined by forming the average of a predetermined number N of the most recently received samples, according to the expression:

$$Xmean = N^{-1} \Sigma x_{i-n}$$

where the summation is carried out for values of n ranging from 1 to N. In a TDMA system, the number of samples averaged might be limited to the range of about 150 to about 170 for practical reasons and because more accuracy is typically unnecessary. (Each burst in a GSM-type communication system includes roughly 150–170 data bits.) Nevertheless, there are circumstances in which it is desirable if not necessary to process a large number of bits, for example when monitoring frequency correction bursts. In GSM, five of each frame of fifty-one slots are used for transmitting an unmodulated carrier (the "frequency correction bursts", or FCH), which the mobile may detect using a narrowband filter to yield coarse timing and frequency error estimation. Since Xmean is a sliding average, the number of processed bits is unlimited in principle.

Changes in the d.c. level can be detected (step 305) by choosing an upper limit, xmax, and a lower limit, xmin, and comparing the current sample $x_i$ to these limits. This method of detecting a change in the d.c. level is illustrated in FIG. 4, in which step 401 depicts choosing the upper and lower limits and step 403 depicts comparing a current sample to the limits. If the value of the current sample is greater than xmax or less than xmin, then a change in the d.c. level is inferred (step 405). The limits xmax, xmin can be chosen in several ways, for example, by setting them at the highest and lowest sample values observed in the most recent, predetermined time period. In addition, it will be understood that one may use any of the techniques for detecting an interferer's presence that are described in U.S. Pat. No. 5,579,347, which is cited and incorporated by reference above.

In normal signal processing, i.e., when there is no large change in Xmean, the mean value can be determined with high precision by averaging a large number of samples. Moreover, all samples will be within the limits if the values of xmax and xmin are chosen properly. For example, xmax, xmin can be chosen based on the actual signal amplitude (in this case, $xcomp_i$) and knowledge of the amplitude's typical, or expected, variation.

Finding one or more samples outside the limits xmax, xmin is regarded as indicating a change in the d.c. level. In order to track the change faster, the mean value is then adaptively determined by giving a larger weight to the current sample (block 307). To achieve very fast tracking, the mean value can be set equal to the value of the current sample; this gives no weight at all to the previous mean value. When the change has passed, e.g., the former mean value is re-established, the determination of the mean value may continue with increasingly larger number of samples N until the desired high precision is reached. In any case, compensated samples of the base band signal are formed according the expression above by finding the difference between the current samples and the mean value (block 309).

As a specific example of Applicant's method, let Xmean be a sliding mean value that is determined according to the following expression:

$$Xmean(new) = Xmean(old).(N-1)/N + x_i/N$$

where Xmean(new) is the value of Xmean determined for the current sample $x_i$; Xmean(old) is the value of Xmean determined for previous samples; and N is a number of a samples. It will be understood that the factors (N-1)/N and 1/N are weight factors. In the normal case, i.e., when no interferer is switched on or off, the d.c. level can be regarded as a constant and a large value of N can be used, giving an estimate of Xmean having high precision. As an example, let N=32. This gives:

$$Xmean(new) = Xmean(old).31/32 + x_i/32$$

In addition, let the limits xmax, xmin be based on twice the previous maximal sample value, which is to say:

$$xmax = Xmean + 2.max|x - Xmean|$$

and $$xmin = Xmean - 2.max|x - Xmean|$$

where the sample values x range from the current sample $x_i$ through a previous sample, such as the previous sample $x_{i-N}$.

As noted above, finding one or more samples outside the limits xmax, xmin indicates a step in the d.c. level, and causes a reduction in the value of N in order to track the step better. For example, N can be reduced from 32 to 2, giving $$Xmean(new) = Xmean(old)/2 + x_i/2$$

When the current sample $x_i$ returns to within the limits xmax, xmin, the value of N is increased. For the first sample returning within the limits, N is set to 4; for the second consecutive sample within the limits, N is set to 8; for the third consecutive sample within the limits, N is set to 16; and for the fourth consecutive sample within the limits, N is returned to 32.

It will be recognized that samples received during a sharp step will be demodulated with poor precision. In many applications, such as mobile communications, this may not be a problem. Robust information coding and error correction methods can cope with bit errors during a limited time without loss of overall communication quality. In the worst case, a few information symbols could be lost due to differences between the compensated and actual base band signals. This can often be neglected in communication systems having robust channel coding and interleaving, such as the GSM and DCS 1800 systems.

It will be understood that a method in accordance with Applicant's invention is well suited, but not limited, to removing base band d.c. offsets in a homodyne radio receiver. Such a method is suitable for correcting a stream of samples, regardless of length, and the method can handle any kind of d.c. offset, varying or constant. The method can also handle repeated ramps or steps in the d.c. offset. There is no need for post-processing of data, which is important for applications such as cellular phones that demand real-time operation. Signal processing is performed continuously without delaying the output significantly, and the method may be implemented very effectively in hardware, e.g., in an integrated circuit with only a small amount of area needed. There is no need for large data storage units and no complex arithmetic processing.

It will be appreciated by those of ordinary skill in the art that this invention can be embodied in other forms without departing from its essential nature. Therefore, the embodiments described above must be considered in all respects as illustrative and not restrictive. The scope of the invention is defined by the following claims.

What is claimed is:

1. In a direct-conversion receiver, an apparatus for compensating a current sample of a base band signal having a variable d.c. level, comprising:

means for generating samples of the base band signal;

means for forming an estimate of a mean value of the samples;

means for detecting a change in the d.c. level of the base band signal based on the current sample; and means for generating the compensated sample by forming a difference between the current sample and the estimate, thereby substantially removing the change in the d.c. level.

2. The apparatus of claim 1, wherein the detecting means includes:

means for determining an upper limit value and a lower limit value, the upper and lower limit values being based on a maximal one of the samples of the base band signal, and means for comparing the current sample to the upper and lower limit values, the change in the d.c. level of the base band signal being detected when the current sample exceeds one of the limit values;

and wherein the estimate forming means includes:

means for adaptively determining an average of a number of the samples of the base band signal, the number of samples corresponding to whether a change in the d.c. level has been detected.

3. A method of compensating a current sample of a base band signal having a variable d.c. level, comprising the steps of:

generating samples of the base band signal;

forming an estimate of a mean value of the samples;

detecting a change in the d.c. level of the base band signal; and when a change is detected, generating the compensated sample by forming a difference between the current sample and the estimate, thereby substantially removing the change in the d.c. level.

4. The method of claim 3, wherein the detecting step includes the steps of:

determining an upper limit value and a lower limit value based on a maximal one of the samples of the base band signal, and comparing the current sample to the upper and lower limit values, the change in the d.c. level of the base band signal being detected when the current sample exceeds one of the limit values;

and wherein the step of forming an estimate includes the steps of:

adaptively determining an average of a number of the samples of the base band signal, the number of samples corresponding to whether a change in the d.c. level has been detected.

* * * * *